US008927395B2

(12) United States Patent
Nakamura (10) Patent No.: US 8,927,395 B2
(45) Date of Patent: Jan. 6, 2015

(54) WAFER PROCESSING METHOD

(71) Applicant: Disco Corporation, Tokyo (JP)

(72) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/206,331

(22) Filed: Mar. 12, 2014

(65) Prior Publication Data

US 2014/0295643 A1     Oct. 2, 2014

(30) Foreign Application Priority Data

Mar. 27, 2013   (JP) ................................. 2013-066524

(51) Int. Cl.
| | |
|---|---|
| H01L 21/78 | (2006.01) |
| H01L 21/683 | (2006.01) |
| B23K 26/00 | (2014.01) |
| H01L 21/268 | (2006.01) |
| H01L 21/67 | (2006.01) |
| B23K 26/40 | (2014.01) |

(52) U.S. Cl.
CPC ............ *H01L 21/78* (2013.01); *H01L 21/6836* (2013.01); *B23K 26/0057* (2013.01); *B23K 26/0063* (2013.01); *H01L 21/268* (2013.01); *H01L 21/67092* (2013.01); *B23K 26/4075* (2013.01)
USPC ........... 438/463; 438/113; 438/462; 438/464; 257/E21.599; 257/E21.596

(58) Field of Classification Search
CPC ..... H01L 21/78; H01L 21/268; H01L 21/683; H01L 21/67092; H01L 21/6836; H01L 21/6835; B23K 26/0057; B23K 26/4075; B23K 26/0063; B23K 26/367
USPC .......... 438/462, 463, 464, 113; 257/E21.599, 257/E21.596
See application file for complete search history.

(56) References Cited

U.S. PATENT DOCUMENTS

| 7,179,721 B2 * | 2/2007 | Nagai ............................ 438/460 |
| 7,682,858 B2 * | 3/2010 | Nagai et al. ..................... 438/33 |
| 8,703,582 B2 * | 4/2014 | Abe ............................... 438/463 |
| 2009/0142906 A1 * | 6/2009 | Nakamura ..................... 438/463 |
| 2009/0298263 A1 * | 12/2009 | Watanabe et al. ............. 438/463 |

FOREIGN PATENT DOCUMENTS

| JP | 2002-192370 | 7/2002 |
| JP | 2009-140947 | 6/2009 |

* cited by examiner

*Primary Examiner* — Michael Trinh
(74) *Attorney, Agent, or Firm* — Greer Burns & Crain, Ltd.

(57) ABSTRACT

In a wafer processing method, a modified layer is formed inside a wafer along planned dividing lines by irradiating the wafer with a laser beam with such a wavelength as to be transmitted through the wafer from the back surface side of the wafer along the dividing lines. A first modified layer is formed near the back surface of the wafer by irradiating the wafer with the light focal point of the laser beam positioned near the back surface of the wafer. The wafer is then irradiated with the light focal point of the laser beam positioned on the front surface side. Then plural second modified layers are formed in a multi-layering manner with sequential movement of the light focal point toward an area leading to the first modified layer. The wafer is divided into individual devices along the dividing lines by applying an external force to the wafer.

2 Claims, 10 Drawing Sheets

WAFER PROCESSING METHOD

BACKGROUND OF THE INVENTION

1. Field of the Invention

The present invention relates to a wafer processing method to divide a wafer on which plural planned dividing lines are formed in a lattice manner on the front surface and devices are formed in plural areas partitioned by the plural planned dividing lines, into the individual devices along the planned dividing lines.

2. Description of the Related Art

In a semiconductor device manufacturing process, plural areas are partitioned by planned dividing lines arranged in a lattice manner on a surface of a semiconductor wafer having a substantially circular disc shape and devices such as ICs and LSIs are formed in these partitioned areas. Then, the semiconductor wafer is cut along the planned dividing lines to separate the areas in which the devices are formed, so that the individual devices are manufactured.

Furthermore, in an optical device manufacturing process, optical device layers formed of an n-type nitride semiconductor layer and a p-type nitride semiconductor layer are stacked over a surface of a sapphire substrate or a silicon carbide substrate and optical devices such as light emitting diodes and laser diodes are formed in plural areas partitioned by plural planned dividing lines formed in a lattice manner to form an optical device wafer. Then, the optical device wafer is cut along the planned dividing lines to separate the areas in which the optical devices are formed, so that the individual optical devices are manufactured.

As a method for dividing the wafer such as the above-described semiconductor wafer and optical device wafer, a laser processing method has been put into practical use in which a pulse laser beam with such a wavelength as to be transmitted through the wafer is used and the wafer is irradiated with the pulse laser beam with the light focal point positioned inside the area along which the wafer should be divided. The dividing method using this laser processing method is a technique in which a wafer is irradiated with a pulse laser beam with such a wavelength as to be transmitted through the wafer with the light focal point positioned inside from one surface side of the wafer to thereby continuously form a modified layer inside the processing-target object along the planned dividing lines and an external force is applied along the planned dividing lines, on which the strength is lowered due to the formation of this modified layer, to thereby divide the wafer (refer to e.g. Japanese Patent No. 3408805).

In the technique described in Japanese Patent No. 3408805, the light focal point of the laser beam needs to be positioned inside the wafer. Therefore, a protective tape is attached to the front surface, on which devices are formed. Furthermore, the protective tape side is held on a chuck table of the laser beam and the wafer is irradiated with the laser beam from the back surface side of the wafer. In the case of forming plural modified layers in a multi-layering manner, the irradiation is performed with the light focal point of the laser beam positioned near the front surface at first and then the modified layers are formed in a multi-layered manner with the sequential movement of the light focal point toward the back surface side (refer to e.g. Japanese Patent Laid-open No. 2009-140947).

Forming the modified layers in a multi-layering manner with the sequential movement of the light focal point from the front surface side of the wafer toward the back surface side in this manner is based on a thought that, if the modified layer is formed near the back surface at first, the modified layer already formed inhibits the irradiation with the laser beam when the light focal point of the laser beam is brought closer to the front surface.

SUMMARY OF THE INVENTION

However, if the modified layer is formed inside the wafer, cracks are generated on the back surface side, on which the laser beam is incident. This causes the following problem. Specifically, when the irradiation is performed with the light focal point of the laser beam positioned near the front surface at first and then the modified layers are formed with the sequential movement of the light focal point toward the back surface side, the cracks isotropically grow on the back surface side and irregularities are generated in the cut planes near the back surface. This decreases the deflective strength or die strength of the devices. In addition, dust is scattered and contaminates bonding pads, which lowers the quality of the devices.

Therefore, an object of the present invention is to provide a wafer processing method that allows a wafer to be divided into individual devices without generating irregularities in the cut planes near the back surface of the wafer.

In accordance with an aspect of the present invention, there is provided a wafer processing method to divide a wafer on which a plurality of planned dividing lines are formed in a lattice manner on a front surface and devices are formed in a plurality of areas partitioned by the plurality of planned dividing lines, into individual devices along the planned dividing lines. The wafer processing method includes: a modified layer forming step of forming a modified layer inside the wafer along the planned dividing lines by irradiating the wafer with a laser beam with such a wavelength as to be transmitted through the wafer from the back surface side of the wafer along the planned dividing lines; and a dividing step of dividing the wafer into the individual devices along the planned dividing lines along which the modified layer is formed by applying an external force to the wafer after the modified layer forming step. The modified layer forming step includes: a first modified layer forming step of forming a first modified layer near a back surface of the wafer by irradiating the wafer with the laser beam in such a manner that a light focal point of the laser beam is positioned near the back surface of the wafer; and a second modified layer forming step of irradiating the wafer after the first modified layer forming step with the laser beam in such a manner that the light focal point of the laser beam is positioned on the front surface side distant from the first modified layer in the wafer and then forming a plurality of second modified layers in a multi-layering manner with the sequential movement of the light focal point toward an area leading to the first modified layer.

It is preferable that, after the second modified layer forming step, a third modified layer forming step is performed to form a third modified layer near the front surface of the wafer by irradiating the wafer with the laser beam in such a manner that the light focal point of the laser beam is positioned closer to the front surface of the wafer than the second modified layers.

The wafer processing method according to the present invention includes: the first modified layer forming step of forming the first modified layer near the back surface of the wafer; and the second modified layer forming step of irradiating the wafer after the first modified layer forming step with the laser beam in such a manner that the light focal point of the laser beam is positioned on the front surface side distant from the first modified layer in the wafer and then forming the plurality of second modified layers in a multi-layering manner with the sequential movement of the light focal point toward the area leading to the first modified layer. Therefore, when the second modified layer forming step is performed, cracks generated from the second modified layers sequentially formed from the front surface side distant from the first modified layer in the wafer toward the first modified layer are led to the first modified layer, which is first formed near the back surface, to become anisotropic and be absorbed. This suppresses generation of irregularities in the cut planes near the back surface in the state in which the wafer is cut along the planned dividing lines along which the first modified layer and the second modified layers are formed. Thus, the problems that the deflective strength of the devices is decreased and dust is scattered and contaminates bonding pads to lower the quality of the devices are eliminated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
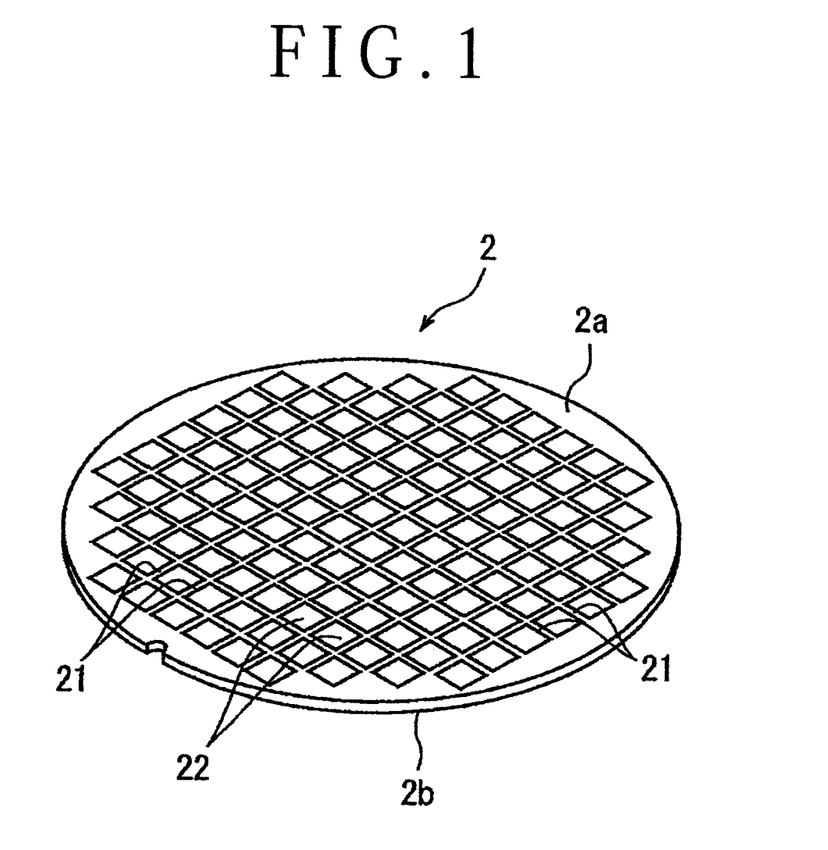
FIG. 1 is a perspective view of a semiconductor wafer to be processed by a wafer processing method according to the present invention.

A wafer processing method according to a preferred embodiment of the present invention will be described in detail below with reference to the accompanying drawings. In FIG. 1, a perspective view of a semiconductor wafer as a wafer to be processed in accordance with the present invention is shown. A semiconductor wafer 2 shown in FIG. 1 is formed of a silicon wafer having a diameter of 200 mm and a thickness of e.g. 600 μm. Plural planned dividing lines 21 are formed in a lattice manner on a front surface 2a. In addition, devices 22 such as ICs and LSIs are formed in plural areas partitioned by the plural planned dividing lines 21. In the following, a description will be made about the wafer processing method to divide the above-described semiconductor wafer 2 into the individual devices 22 along the planned dividing lines 21.

Figure 2:
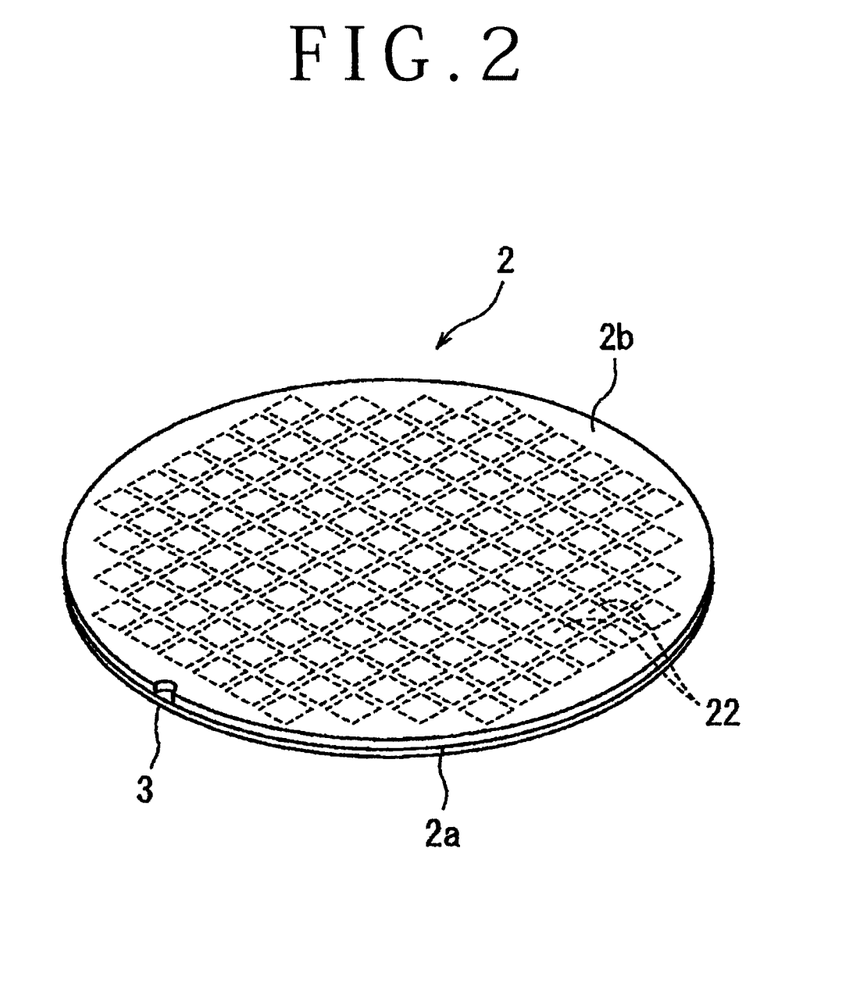
FIG. 2 is a perspective view showing a state in which a protective tape is attached to the front surface of the semiconductor wafer shown in FIG. 1.

As shown in FIG. 2, a protective tape 3 is attached to the front surface 2a of the semiconductor wafer 2 in order to protect the devices 22 (protective tape attaching step). After the protective tape attaching step is carried out, a modified layer forming step is carried out. In this step, the semiconductor wafer 2 is irradiated with a laser beam with such a wavelength as to be transmitted through the semiconductor wafer 2 from the back surface side of the semiconductor wafer 2 along the planned dividing lines 21 to form a modified layer inside the wafer along the planned dividing lines 21. This modified layer forming step is carried out by using a laser processing apparatus 4 shown in FIG. 3. The laser processing apparatus 4 shown in FIG. 3 includes a chuck table 41 to hold a processing-target object, laser beam irradiating means 42 to irradiate the processing-target object held on this chuck table 41 with a laser beam, and imaging means 43 to image the processing-target object held on the chuck table 41. The chuck table 41 is so configured as to suck and hold the processing-target object and is allowed to be moved in a processing feed direction indicated by an arrow X and in an indexing feed direction indicated by an arrow Y in FIG. 3 by a movement mechanism (not shown).

Figure 3:
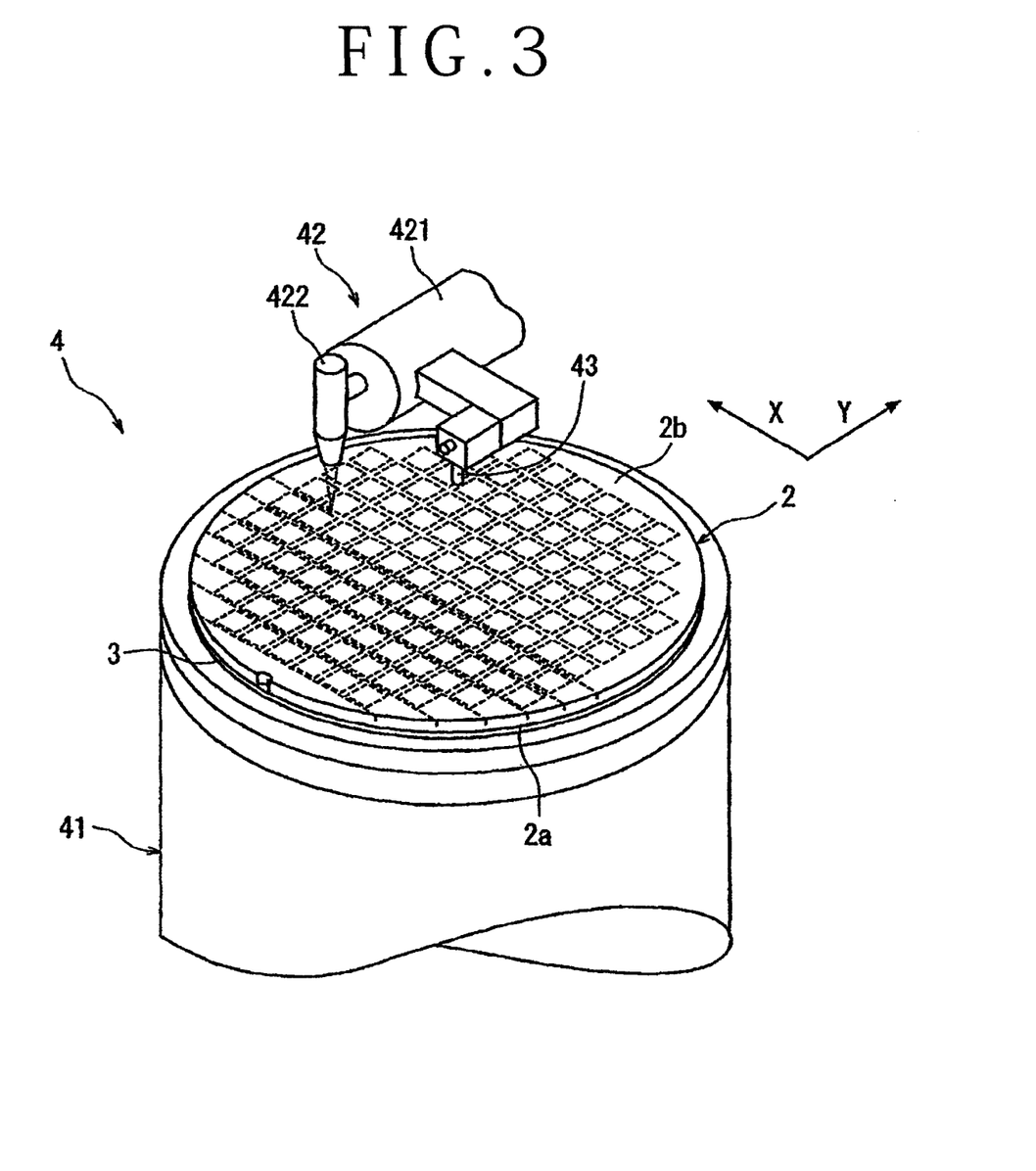
FIG. 3 is a perspective view of a major part of a laser processing apparatus for carrying out a modified layer forming step.

The laser beam irradiating means 42 includes a cylindrical casing 421 disposed substantially horizontally. In the casing 421, pulse laser beam oscillating means (not shown) including a pulse laser beam oscillator formed of a YAG laser oscillator or a YVO4 laser oscillator and repetition frequency setting means is disposed. At the tip part of the casing 421, a light collector 422 for collecting a pulse laser beam oscillated from the pulse laser beam oscillating means is mounted.

In the present embodiment, the imaging means 43 mounted on the casing 421 is composed of the following components besides a normal imaging element (CCD) to perform imaging by a visible light ray: infrared illuminating means to radiate infrared to the processing-target object; an optical system to capture the infrared radiated by this infrared illuminating means; an imaging element (infrared CCD) that outputs an electric signal corresponding to the infrared captured by this optical system; and so forth. The imaging means 43 sends an image signal obtained by imaging to control means (not shown).

The modified layer forming step carried out by using the above-described laser processing apparatus 4 will be described with reference to FIGS. 4A to 7C. In this modified layer forming step, a first modified layer forming step is carried out first. In this step, the semiconductor wafer 2 is irradiated with a laser beam with the light focal point of the laser beam positioned near the back surface of the semiconductor wafer 2 to form a first modified layer near the back surface of the semiconductor wafer 2. To carry out this first modified layer forming step, the side of the protective tape 3 attached to the front surface 2a of the semiconductor wafer 2 is placed on the chuck table 41 of the laser processing apparatus 4 shown in the above-described FIG. 3. Then, the semiconductor wafer 2 is sucked and held over the chuck table 41 by actuating sucking means (not shown) (wafer holding step). Therefore, in the semiconductor wafer 2 held over the chuck table 41 with the intermediary of the protective tape 3, the back surface 2b is oriented toward the upper side. The chuck table 41 that has sucked and held the semiconductor wafer 2 in this manner is positioned directly beneath the imaging means 43 by processing feed means (not shown).

After the chuck table 41 is positioned directly beneath the imaging means 43, alignment operation of detecting the processing area for which laser processing should be performed on the semiconductor wafer 2 is executed by the imaging means 43 and the control means (not shown). Specifically, the imaging means 43 and the control means (not shown) carry out alignment of the laser beam irradiation position by executing image processing such as pattern matching for aligning the planned dividing line 21 formed along a first direction of the semiconductor wafer 2 with the light collector 422 of the laser beam irradiating means 42 to radiate a laser beam along the planned dividing line 21. Furthermore, also for the planned dividing line 21 that is formed on the semiconductor wafer 2 and extends along a direction perpendicular to the first direction, the alignment of the laser beam irradiation position is similarly carried out. At this time, the front surface 2a, on which the planned dividing lines 21 are formed, of the semiconductor wafer 2 is located on the lower side. However, the imaging means 43 includes imaging means composed of the infrared illuminating means, the optical system to capture the infrared, the imaging element (infrared CCD) that outputs an electric signal corresponding to the infrared, and so forth as described above. This allows the planned dividing lines 21 to be imaged from the back surface 2b in a see-through manner.

Figure 4A:
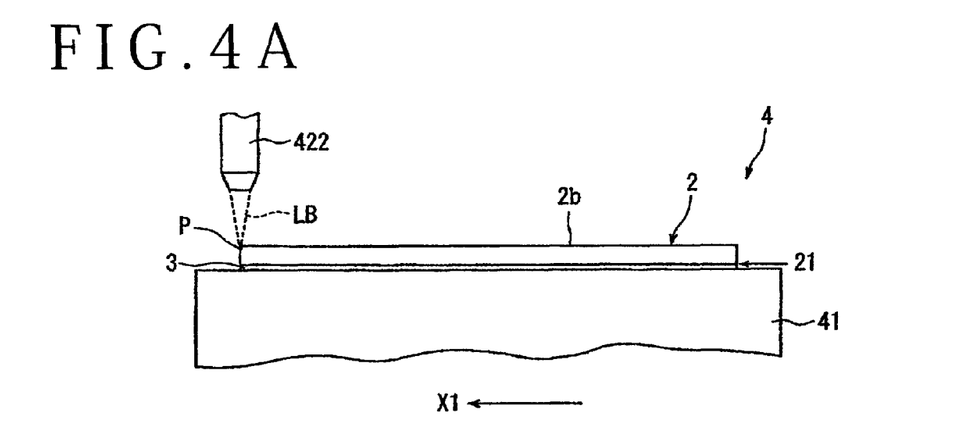
FIGS. 4A to 4C are explanatory diagrams of a first modified layer forming step.
Figure 4B:
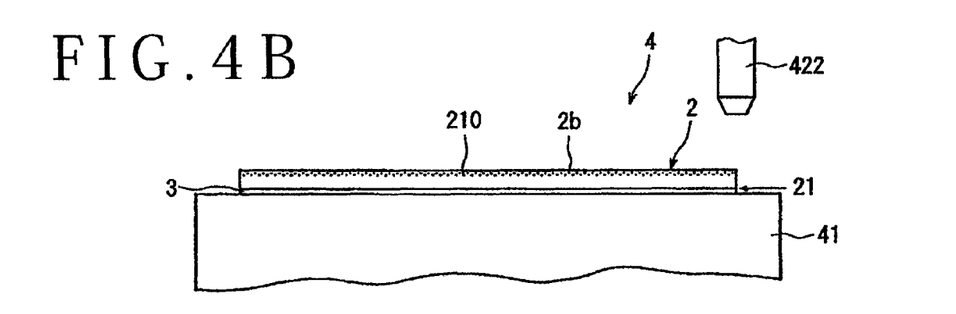
Figure 4C:
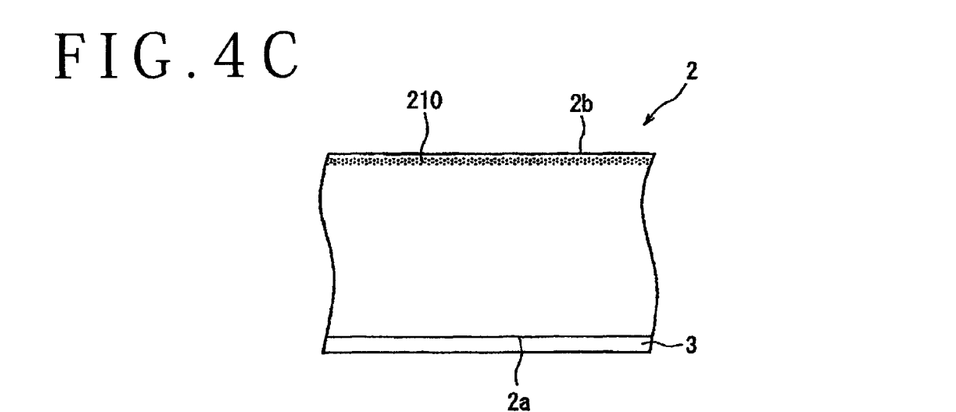

After the planned dividing lines 21 formed on the semiconductor wafer 2 held over the chuck table 41 are detected and alignment of the laser beam irradiation position is carried out in the above-described manner, as shown in FIG. 4A, the chuck table 41 is moved to the laser beam irradiation area above which the light collector 422 of the laser beam irradiating means 42 to radiate the laser beam is located and one end of a predetermined planned dividing line 21 (left end, in FIG. 4A) is positioned directly beneath the light collector 422 of the laser beam irradiating means 42. Next, a light focal point P of the pulse laser beam radiated from the light collector 422 is positioned near the back surface 2b (irradiated surface as the upper surface) of the semiconductor wafer 2 (e.g. at a position closer to the front surface 2a by 30 μm relative to the back surface 2b). Then, the chuck table 41 is moved in a direction indicated by an arrow X1 in FIG. 4A at a predetermined feed rate while the pulse laser beam with such a wavelength as to be transmitted through the silicon wafer is radiated from the light collector 422. Then, when the irradiation position of the light collector 422 of the laser beam irradiating means 42 has reached the position of the other end of the planned dividing line 21 as shown in FIG. 4B, the radiation of the pulse laser beam is stopped and the movement of the chuck table 41 is stopped. As a result, as shown in FIG. 4C, near the back surface 2b (irradiated surface as the upper surface) of the semiconductor wafer 2, a first modified layer 210 is so formed along the planned dividing line 21 as to be centered at the position closer to the front surface 2a by 30 μm relative to the back surface 2b (first modified layer forming step).

The processing conditions in the first modified layer forming step are set as follows for example.
 Light source: LD-pumped Q-switch Nd:YVO4 pulse laser
 Wavelength: 1064 nm
 Repetition frequency: 1 MHz
 Average output: 0.7 W
 Focal spot diameter: 1 μm
 Processing feed rate: 700 mm/seconds After the first modified layer forming step is carried out along the predetermined planned dividing line 21 in the above-described manner, the chuck table 41 is subjected to indexing movement in the direction indicated by the arrow Y by the interval between the planned dividing lines 21 formed on the semiconductor wafer 2 (indexing step) and the first modified layer forming step is carried out. When the first modified layer forming step has been carried out along all planned dividing lines 21 formed along the first direction in this manner, the chuck table 41 is rotated by 90 degrees and the first modified layer forming step is carried out along the planned dividing line 21 extending along the direction perpendicular to the planned dividing lines 21 formed along the first direction.

After the first modified layer forming step described above is carried out, a second modified layer forming step is carried out. In this step, the semiconductor wafer 2 is irradiated with a laser beam with the light focal point of the laser beam positioned on the side of the front surface 2a distant from the first modified layer 210 in the semiconductor wafer 2. Thereafter, plural second modified layers are formed in a multi-layered manner with the sequential movement of the light focal point toward the area leading to the first modified layer 210.

Figure 5A:
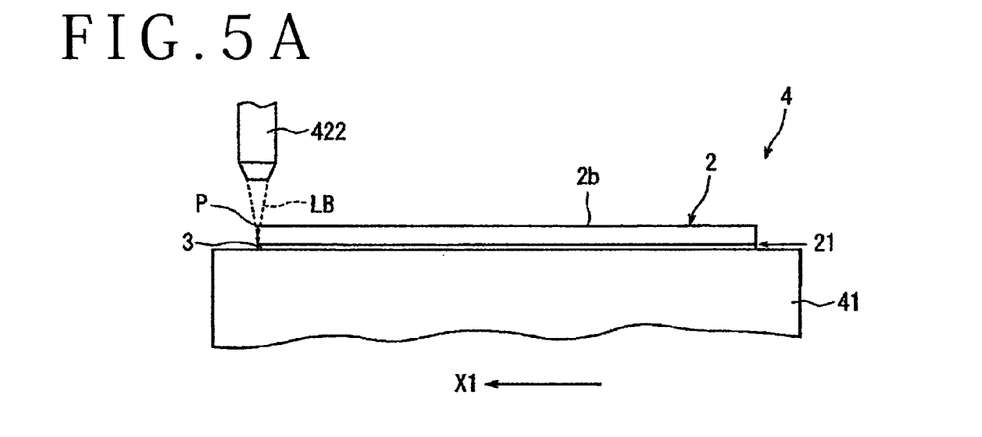
FIGS. 5A to 5C are explanatory diagrams of a second modified layer forming step.
Figure 5B:
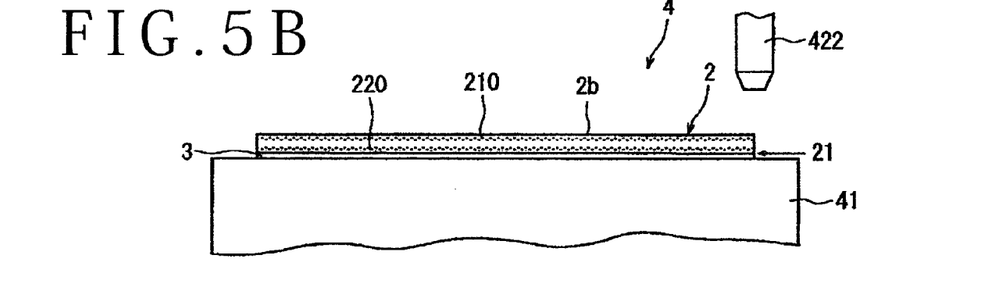
Figure 5C:
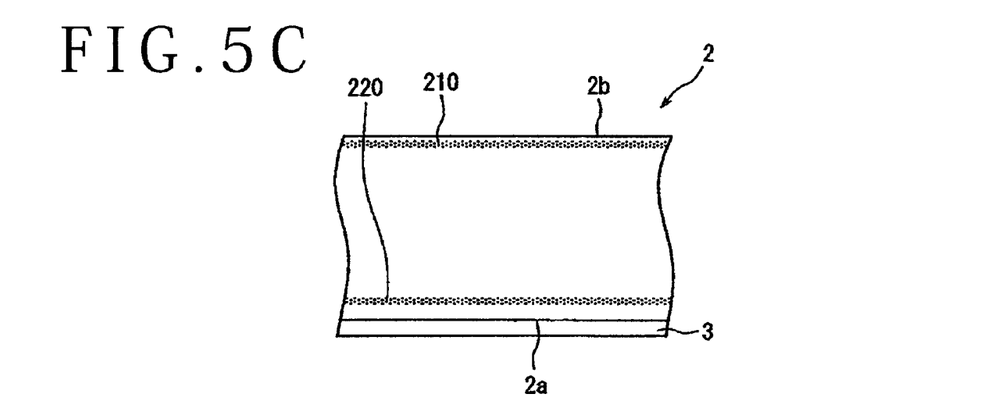

In the second modified layer forming step, as shown in FIG. 5A, the chuck table 41 is moved to the laser beam irradiation area above which the light collector 422 of the laser beam irradiating means 42 to radiate the laser beam is located and one end of a predetermined planned dividing line 21 (left end, in FIG. 5A) is positioned directly beneath the light collector 422 of the laser beam irradiating means 42. Next, the light focal point P of the pulse laser beam radiated from the light collector 422 is positioned on the side of the front surface 2a distant from the first modified layer 210 in the semiconductor wafer 2. At this time, in the present embodiment, the light focal point P of the pulse laser beam is positioned at a position closer to the back surface 2b by e.g. 60 μm relative to the front surface 2a. Then, the chuck table 41 is moved in the direction indicated by the arrow X1 in FIG. 5A at a predetermined feed rate while the pulse laser beam with such a wavelength as to be transmitted through the silicon wafer is radiated from the light collector 422. Then, when the irradiation position of the light collector 422 of the laser beam irradiating means 42 has reached the position of the other end of the planned dividing line 21 as shown in FIG. 5B, the radiation of the pulse laser beam is stopped and the movement of the chuck table 41 is stopped. As a result, as shown in FIG. 5C, a second modified layer 220 is so formed along the planned dividing line 21 as to be centered at the position closer to the back surface 2b by e.g. 60 μm relative to the front surface 2a of the semiconductor wafer 2 (second modified layer forming step).

The processing conditions in the second modified layer forming step are set as follows for example.
 Light source: LD-pumped Q-switch Nd:YVO4 pulse laser
 Wavelength: 1064 nm
 Repetition frequency: 1 MHz
 Average output: 0.5 W
 Focal spot diameter: 1 μm
 Processing feed rate: 700 mm/seconds After the second modified layer forming step is carried out along the predetermined planned dividing line 21 in the above-described manner, the chuck table 41 is subjected to indexing movement in the direction indicated by the arrow Y by the interval between the planned dividing lines 21 formed on the semiconductor wafer 2 (indexing step) and the second modified layer forming step is carried out. When the second modified layer forming step has been carried out along all planned dividing lines 21 formed along the first direction in this manner, the chuck table 41 is rotated by 90 degrees and the second modified layer forming step is carried out along the planned dividing line 21 extending along the direction perpendicular to the planned dividing lines 21 formed along the first direction.

Figure 6:
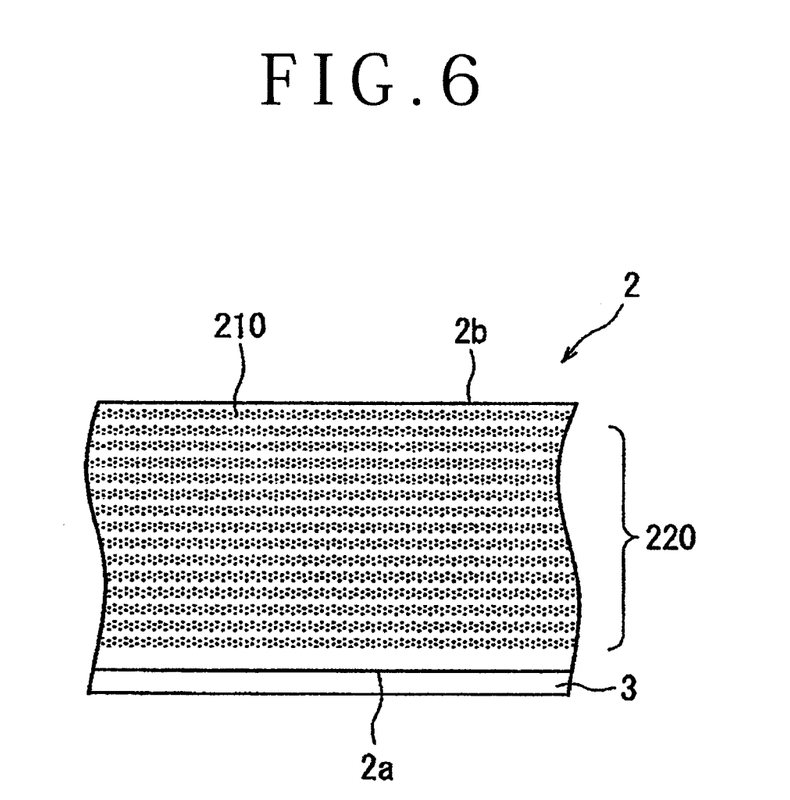
FIG. 6 is a sectional view of the semiconductor wafer for which the second modified layer forming step has been carried out.

After the second modified layer 220 is formed on the side of the front surface 2a distant from the first modified layer 210 in the semiconductor wafer 2 in the above-described manner, the second modified layer forming step is carried out with the sequential movement of the light focal point P of the pulse laser beam with each movement amount of e.g. 40 μm toward the area leading to the first modified layer 210. As a result, in the semiconductor wafer 2, plural second modified layers 220 are formed in a multi-layered manner in the area leading to the first modified layer 210 as shown in FIG. 6. In the second modified layer forming step, the wafer inside is irradiated with the pulse laser beam through the first modified layer 210. However, it has turned out that the second modified layer 220 can be surely formed according to an experiment by the present inventor. If the second modified layer forming step is carried out in this manner, cracks generated from the second modified layers 220 sequentially formed from the side of the front surface 2a in the semiconductor wafer 2 are led to the first modified layer 210, which is first formed near the back surface 2a, to become anisotropic and be absorbed. This suppresses generation of irregularities in the cut planes near the back surface 2b of the semiconductor wafer 2 in the state in which the semiconductor wafer 2 is cut along the planned dividing lines 21, along which the first modified layer 210 and the second modified layers 220 are formed. Thus, the problems that the deflective strength of the devices is decreased and dust is scattered and contaminates bonding pads to lower the quality of the devices are eliminated.

After the above-described second modified layer forming step is carried out, a third modified layer forming step is carried out although not necessarily needed. In this step, the semiconductor wafer 2 is irradiated with a pulse laser beam with the light focal point of the pulse laser beam positioned closer to the front surface 2a of the semiconductor wafer 2 than the second modified layers 220 to form a third modified layer near the front surface 2a of the semiconductor wafer 2.

Figure 7A:
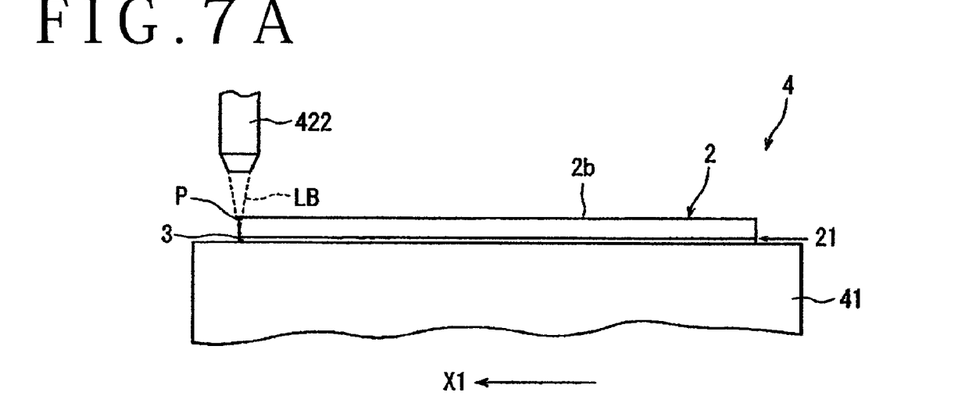
FIGS. 7A to 7C are explanatory diagrams of a third modified layer forming step.
Figure 7B:
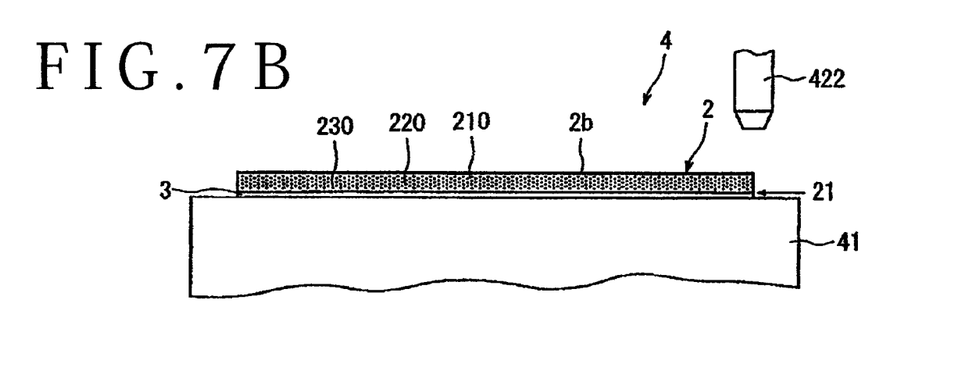
Figure 7C:
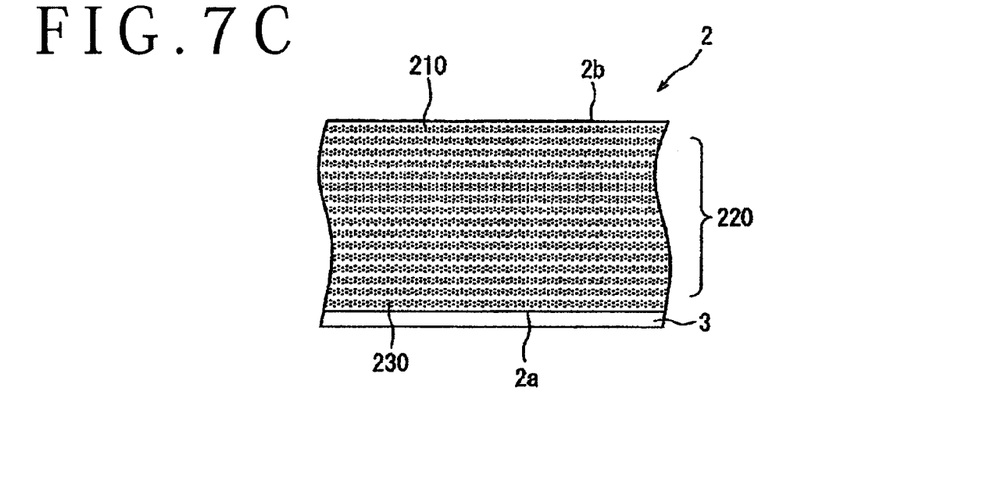

In the third modified layer forming step, as shown in FIG. 7A, the chuck table 41 is moved to the laser beam irradiation area above which the light collector 422 of the laser beam irradiating means 42 to radiate the laser beam is located and one end of a predetermined planned dividing line 21 (left end, in FIG. 7A) is positioned directly beneath the light collector 422 of the laser beam irradiating means 42. Next, the light focal point P of the pulse laser beam radiated from the light collector 422 is positioned closer to the front surface 2a than the second modified layers 220 in the semiconductor wafer 2. At this time, in the present embodiment, the light focal point P of the pulse laser beam is positioned at a position closer to the back surface 2b by e.g. 20 μm relative to the front surface 2a of the semiconductor wafer 2. Then, the chuck table 41 is moved in the direction indicated by the arrow X1 in FIG. 7A at a predetermined feed rate while the pulse laser beam with such a wavelength as to be transmitted through the silicon wafer is radiated from the light collector 422. Then, when the irradiation position of the light collector 422 of the laser beam irradiating means 42 has reached the position of the other end of the planned dividing line 21 as shown in FIG. 7B, the radiation of the pulse laser beam is stopped and the movement of the chuck table 41 is stopped. As a result, as shown in FIG. 7C, a third modified layer 230 is so formed along the planned dividing line 21 as to be centered at the position closer to the back surface 2b by e.g. 20 μm relative to the front surface 2a of the semiconductor wafer 2 (third modified layer forming step). The processing conditions in the third modified layer forming step are set the same as those of the above-described second modified layer forming step in the embodiment shown in the diagrams.

After the third modified layer forming step is carried out along the predetermined planned dividing line 21 in the above-described manner, the chuck table 41 is subjected to indexing movement in the direction indicated by the arrow Y by the interval between the planned dividing lines 21 formed on the semiconductor wafer 2 (indexing step) and the third modified layer forming step is carried out. When the third modified layer forming step has been carried out along all planned dividing lines 21 formed along the first direction in this manner, the chuck table 41 is rotated by 90 degrees and the third modified layer forming step is carried out along the planned dividing line 21 extending along the direction perpendicular to the planned dividing lines 21 formed along the first direction. By forming the third modified layer 230 near the front surface 2a of the semiconductor wafer 2 as above, division of the wafer in a dividing step to be described later is smoothly performed.

Figure 8:
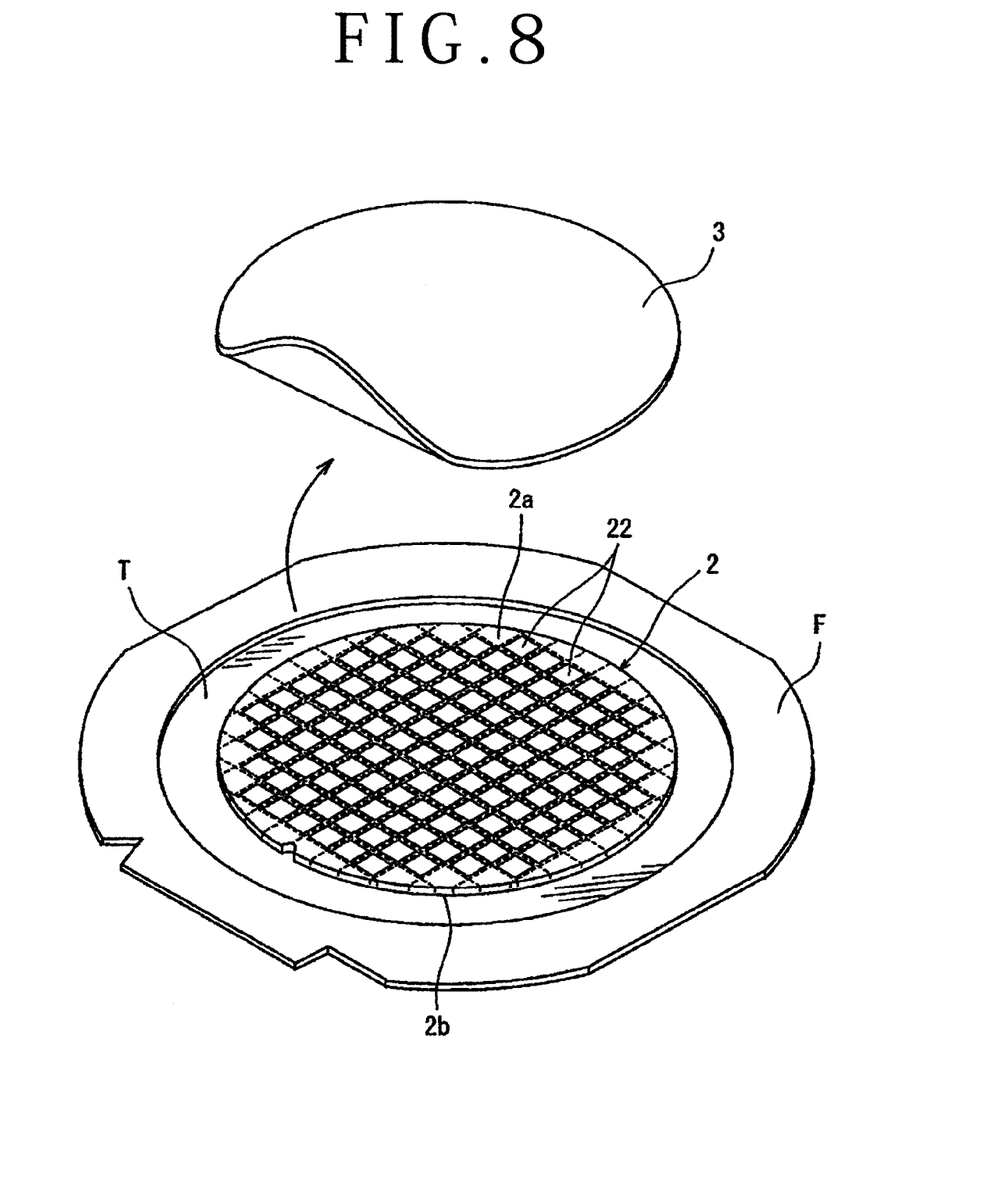
FIG. 8 is an explanatory diagram of a wafer supporting step.

After the modified layer forming step composed of the above-described first modified layer forming step, second modified layer forming step, and third modified layer forming step is carried out, a wafer supporting step is carried out. In this step, the back surface 2b of the semiconductor wafer 2 for which the modified layer forming step has been carried out is attached to the surface of an adhesive tape mounted on a ring-shaped frame. In addition, the protective tape 3 attached to the front surface 2a of the semiconductor wafer 2 is peeled off. Specifically, as shown in FIG. 8, the side of the back surface 2b of the semiconductor wafer 2 is attached to a dicing tape T as an adhesive tape mounted on the ring-shaped frame F. Therefore, the protective tape 3 attached to the front surface 2a of the semiconductor wafer 2 is oriented toward the upper side. Then, the protective tape 3 as a protective member attached to the front surface 2a of the semiconductor wafer 2 is peeled off.

Figure 9:
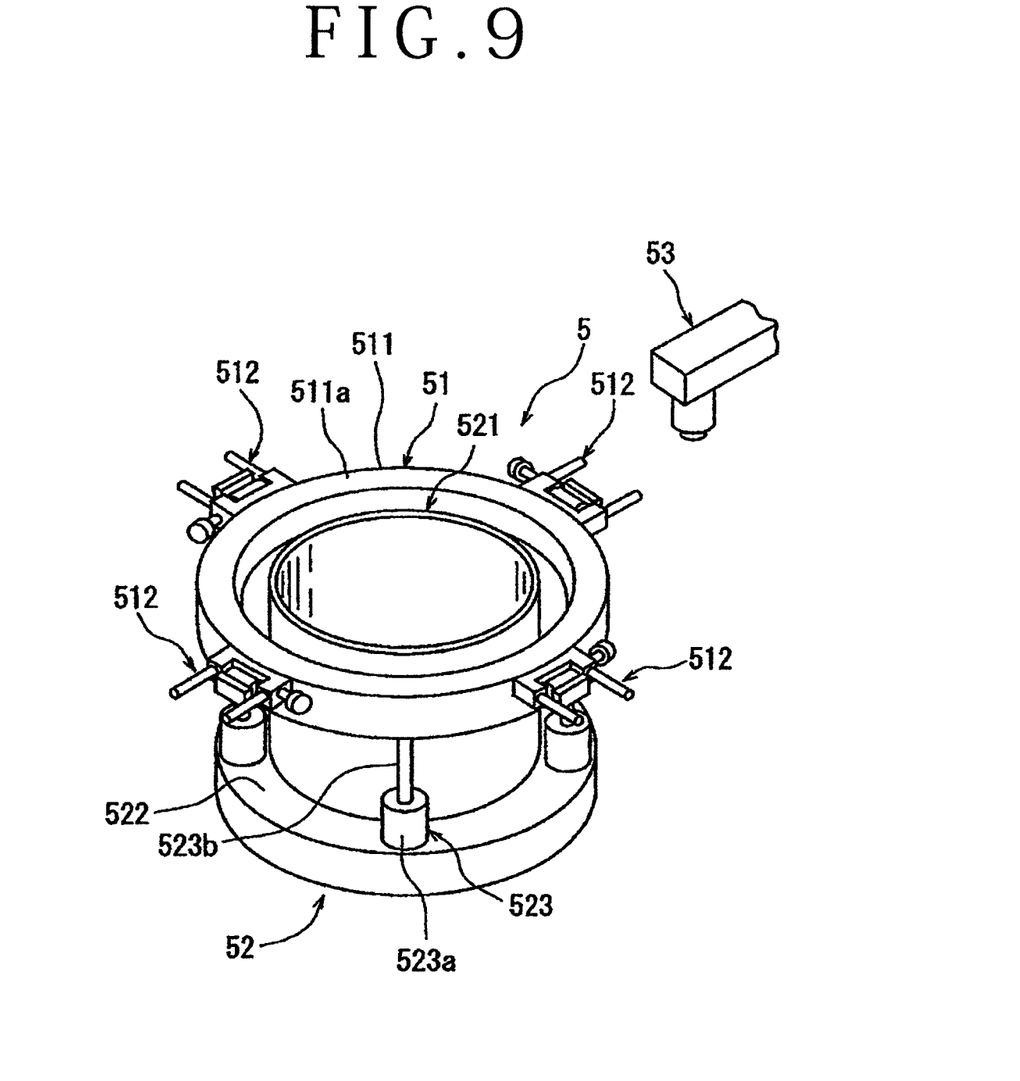
FIG. 9 is a perspective view of a dividing apparatus for carrying out a dividing step.

Next, the dividing step is carried out in which an external force is applied to the semiconductor wafer 2 to divide the semiconductor wafer 2 into the individual devices along the planned dividing lines 21, along which the first modified layer 210, the second modified layers 220, and the third modified layer 230 are formed. This dividing step is carried out by using a dividing apparatus 5 shown in FIG. 9. The dividing apparatus 5 shown in FIG. 9 includes a frame holding means 51 to hold the above-described ring-shaped frame F, a tape expanding means 52 to expand the dicing tape T mounted on the ring-shaped frame F held by this frame holding means 51, and a pick-up collet 53. The frame holding means 51 is composed of a ring-shaped frame holding member 511 and plural clamps 512 as fixing means disposed at the outer circumference of this frame holding member 511. The upper surface of the frame holding member 511 forms a placement surface 511a on which to place the ring-shaped frame F, and the ring-shaped frame F is placed on this placement surface 511a. Furthermore, the ring-shaped frame F placed on the placement surface 511a is fixed to the frame holding member 511 by the clamps 512. The frame holding means 51 configured in this manner is so supported as to be allowed to vertically advance and retract by the tape expanding means 52.

Figure 10A:
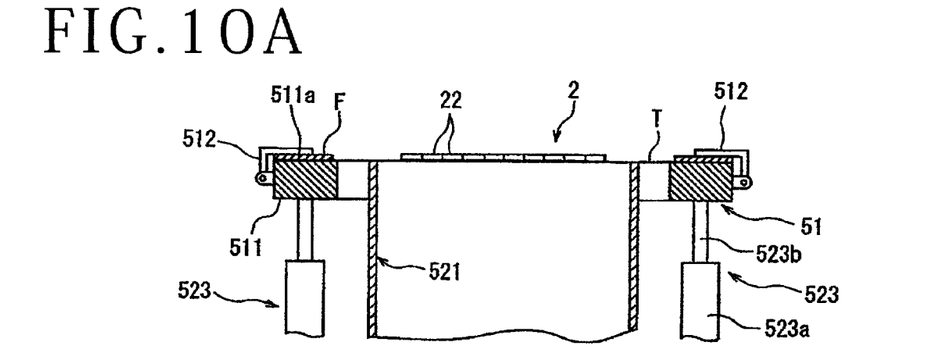
FIGS. 10A to 10C are explanatory diagrams of the dividing step.
Figure 10B:
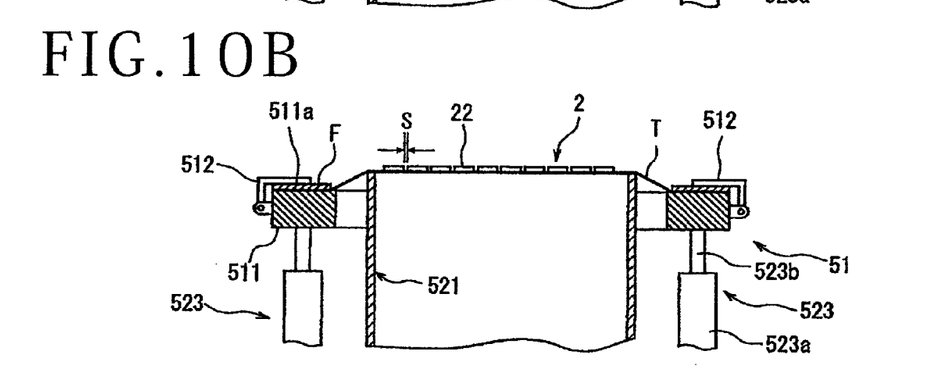

The tape expanding means 52 includes an expanding drum 521 disposed inside the ring-shaped frame holding member 511. This expanding drum 521 has inner diameter and outer diameter that are smaller than the inner diameter of the ring-shaped frame F and are larger than the outer diameter of the semiconductor wafer 2 attached to the dicing tape T mounted on this ring-shaped frame F. Furthermore, the expanding drum 521 has a support flange 522 at the lower end. The tape expanding means 52 in the embodiment shown in the diagram includes support means 523 that allow the ring-shaped frame holding member 511 to vertically advance and retreat. The support means 523 are formed of plural air cylinders 523a disposed on the support flange 522 and piston rods 523b thereof are connected to the lower surface of the ring-shaped frame holding member 511. The support means 523 formed of the plural air cylinders 523a in this manner vertically move the ring-shaped frame holding member 511 between a reference position at which the placement surface 511a is at substantially the same height as the upper end of the expanding drum 521 as shown in FIG. 10A and an expanding position at which the placement surface 511a is lower by a predetermined amount than the upper end of the expanding drum 521 as shown in FIG. 10B.

The dividing step carried out by using the dividing apparatus 5 configured as above will be described with reference to FIGS. 10A to 10C. As shown in FIG. 10A, the ring-shaped frame F on which the dicing tape T attached to the semiconductor wafer 2 is mounted is placed on the placement surface 511a of the frame holding member 511, which forms the frame holding means 51, and is fixed to the frame holding member 511 by the clamps 512 (frame holding step). At this time, the frame holding member 511 is positioned at the reference position shown in FIG. 10A. Next, the plural air cylinders 523a as the support means 523, which form the tape expanding means 52, are actuated to make the ring-shaped frame holding member 511 descend to the expanding position shown in FIG. 10B. Therefore, the ring-shaped frame F fixed onto the placement surface 511a of the frame holding member 511 also descends and thus the dicing tape T mounted on the ring-shaped frame F gets contact with the upper edge of the expanding drum 521 to be expanded as shown in FIG. 10B (tape expanding step). As a result, a tensile force radially acts on the semiconductor wafer 2 attached to the dicing tape T. Accordingly, the semiconductor wafer 2 is separated into the individual devices 22 along the planned dividing lines 21, along which the first modified layer 210, the second modified layers 220, and the third modified layer 230 are formed and thereby the strength is lowered, and gaps S are formed between the devices.

Figure 10C:
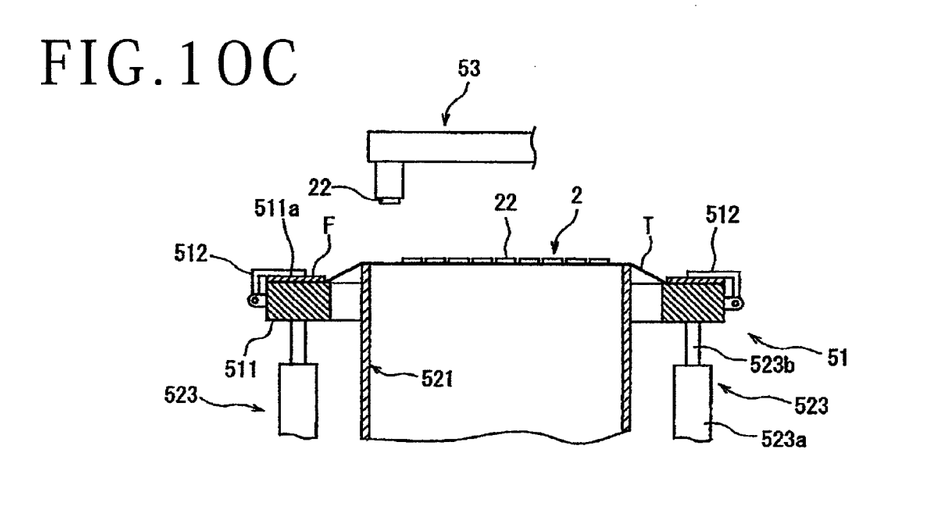

Next, as shown in FIG. 10C, the pick-up collet 53 is actuated to make the device 22 stick thereto. Then, the device 22 is peeled off from the dicing tape T to be picked up and conveyed to a tray or a die-bonding step (not shown). In the pick-up step, the device 22 can be easily picked up without contact with the adjacent devices 22 because the gaps S between the individual devices 22 attached to the dicing tape T are widened as described above.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method to divide a wafer on which a plurality of planned dividing lines are formed in a lattice manner on a front surface and devices are formed in a plurality of areas partitioned by the plurality of planned dividing lines, into individual devices along the planned dividing lines, the wafer processing method comprising:
   a modified layer forming step of forming a modified layer inside the wafer along the planned dividing lines by irradiating the wafer with a laser beam with such a wavelength as to be transmitted through the wafer from a back surface side of the wafer along the planned dividing lines, and
   a dividing step of dividing the wafer into the individual devices along the planned dividing lines along which the modified layer is formed by applying an external force to the wafer after said modified layer forming step,
   wherein said modified layer forming step includes
      a first modified layer forming step of forming a first modified layer near a back surface of the wafer by irradiating the wafer with the laser beam in such a manner that a light focal point of the laser beam is positioned near the back surface of the wafer, and
      a second modified layer forming step of irradiating the wafer after the first modified layer forming step with the laser beam in such a manner that the light focal point of the laser beam is positioned on a front surface side distant from the first modified layer in the wafer and then forming a plurality of second modified layers in a multi-layering manner with sequential movement of the light focal point toward an area leading to the first modified layer.

2. The wafer processing method according to claim 1, wherein, after the second modified layer forming step, a third modified layer forming step is performed to form a third modified layer near the front surface of the wafer by irradiating the wafer with the laser beam in such a manner that the light focal point of the laser beam is positioned closer to the front surface of the wafer than the second modified layers.

* * * * *